US010177285B2

United States Patent
Ruegheimer et al.

(10) Patent No.: US 10,177,285 B2
(45) Date of Patent: Jan. 8, 2019

(54) METHOD OF PRODUCING A HOUSING COVER, METHOD OF PRODUCING AN OPTOELECTRONIC COMPONENT, AND OPTOELECTRONIC COMPONENT

(71) Applicant: OSRAM Opto Semiconductors GmbH, Regensburg (DE)

(72) Inventors: Tilman Ruegheimer, Regensburg (DE); Juergen Dachs, Baar-Ebenhausen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/577,837

(22) PCT Filed: May 27, 2016

(86) PCT No.: PCT/EP2016/062043
§ 371 (c)(1),
(2) Date: Nov. 29, 2017

(87) PCT Pub. No.: WO2016/193160
PCT Pub. Date: Dec. 8, 2016

(65) Prior Publication Data
US 2018/0166611 A1 Jun. 14, 2018

(30) Foreign Application Priority Data
May 29, 2015 (DE) .......... 10 2015 108 494

(51) Int. Cl.
*H01L 33/48* (2010.01)
*H01S 3/02* (2006.01)
(Continued)

(52) U.S. Cl.
CPC ........ *H01L 33/486* (2013.01); *H01L 21/4817* (2013.01); *H01L 33/483* (2013.01);
(Continued)

(58) Field of Classification Search
CPC ................ H01L 33/486; H01L 33/483; H01L 21/02642; H01L 21/0337; H01L 21/67121;
(Continued)

(56) References Cited

U.S. PATENT DOCUMENTS 5,307,434 A * 4/1994 Blonder ............... G02B 6/4202
385/91
6,523,762 B1 * 2/2003 Luginbuhl ........... B41J 2/14233
239/1

(Continued)

FOREIGN PATENT DOCUMENTS

JP 2011-077182 A 4/2011

OTHER PUBLICATIONS

Maah-Sango et al., "Silicon Shadow Masks for Fine-Feature Thin-Film Depositions," IEEE Electron Device Letters, vol. EDL-3, No. 1, Jan. 1982, pp. 21-23.
(Continued)

*Primary Examiner* — Galina Yushina
(74) *Attorney, Agent, or Firm* — DLA Piper LLP (US)

(57) ABSTRACT

A method of producing a housing cover includes providing a cover blank having a mounting surface formed on an underside; connecting the underside of the cover blank to a silicon slice; creating at least one opening in the silicon slice to expose at least part of the mounting surface; arranging a base metallization on the exposed part of the mounting surface; and removing the silicon slice.

17 Claims, 9 Drawing Sheets

(51) Int. Cl.
*H01L 21/48* (2006.01)
*H01S 5/02* (2006.01)
*H01S 5/022* (2006.01)

(52) U.S. Cl.
CPC ........ *H01S 5/0216* (2013.01); *H01S 5/02216* (2013.01); *H01L 2224/48091* (2013.01); *H01L 2933/0033* (2013.01); *H01L 2933/0058* (2013.01); *H01S 5/0206* (2013.01); *H01S 5/02272* (2013.01)

(58) Field of Classification Search
CPC ......... H01L 2023/4031; H01L 2224/01; H01L 2224/02; H01L 2933/0083; H01L 2924/15; H01S 5/0216; H01S 5/0206; H01S 5/0272; H01S 5/0201; H01S 5/022; H01S 3/025; H01W 5/00; H01W 5/0217
See application file for complete search history.

(56) References Cited

U.S. PATENT DOCUMENTS

| | | | |
|---|---|---|---|
| 2004/0067604 A1 | 4/2004 | Ouellet et al. | |
| 2005/0062055 A1 | 3/2005 | Gallup et al. | |
| 2006/0062978 A1* | 3/2006 | Yotsuya | H05K 3/143 428/209 |
| 2006/0273430 A1 | 12/2006 | Hua et al. | |
| 2007/0029654 A1* | 2/2007 | Sunohara | B81C 1/00301 257/678 |
| 2007/0048898 A1 | 3/2007 | Carlson et al. | |
| 2010/0193940 A1* | 8/2010 | Kim | H01L 23/055 257/701 |
| 2010/0207016 A1* | 8/2010 | McBride | G21K 1/00 250/251 |
| 2011/0233694 A1* | 9/2011 | Yoshida | H01L 21/50 257/418 |
| 2013/0101250 A1* | 4/2013 | Desai | G02B 6/4257 385/14 |
| 2014/0332945 A1 | 11/2014 | Chen et al. | |

OTHER PUBLICATIONS

Teruhisa Akashi et al., "Profile Control of a Borosilicate-Glass Groove Formed by Deep Reactive Ion Etching," DTIP of MEMS & MOEMS, Apr. 25-27, 2007.

Matt Apanius et al., "Silicon shadow mask fabrication for patterned metal deposition with microscale dimensions using a novel corner compensation scheme," Science Direct, Sensors and Actuators A: Physical 140, 2007, pp. 168-175.

\* cited by examiner

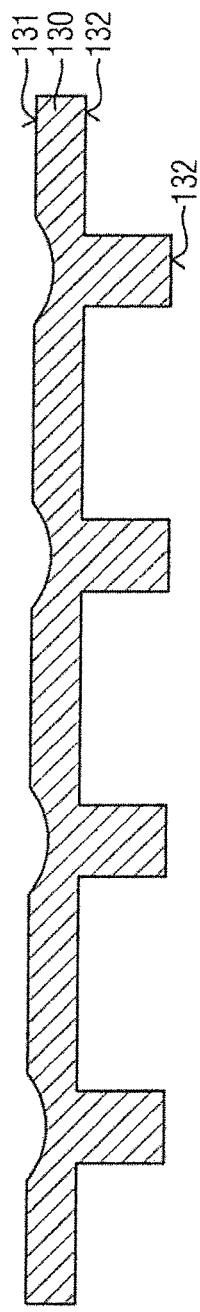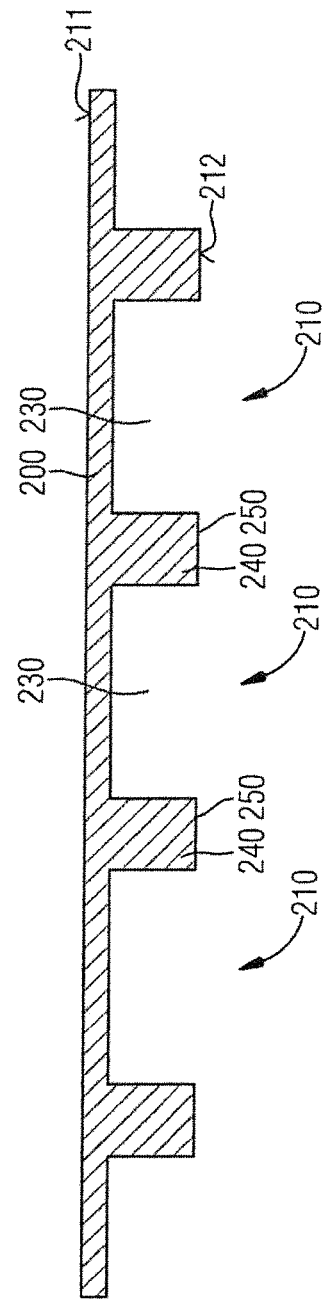

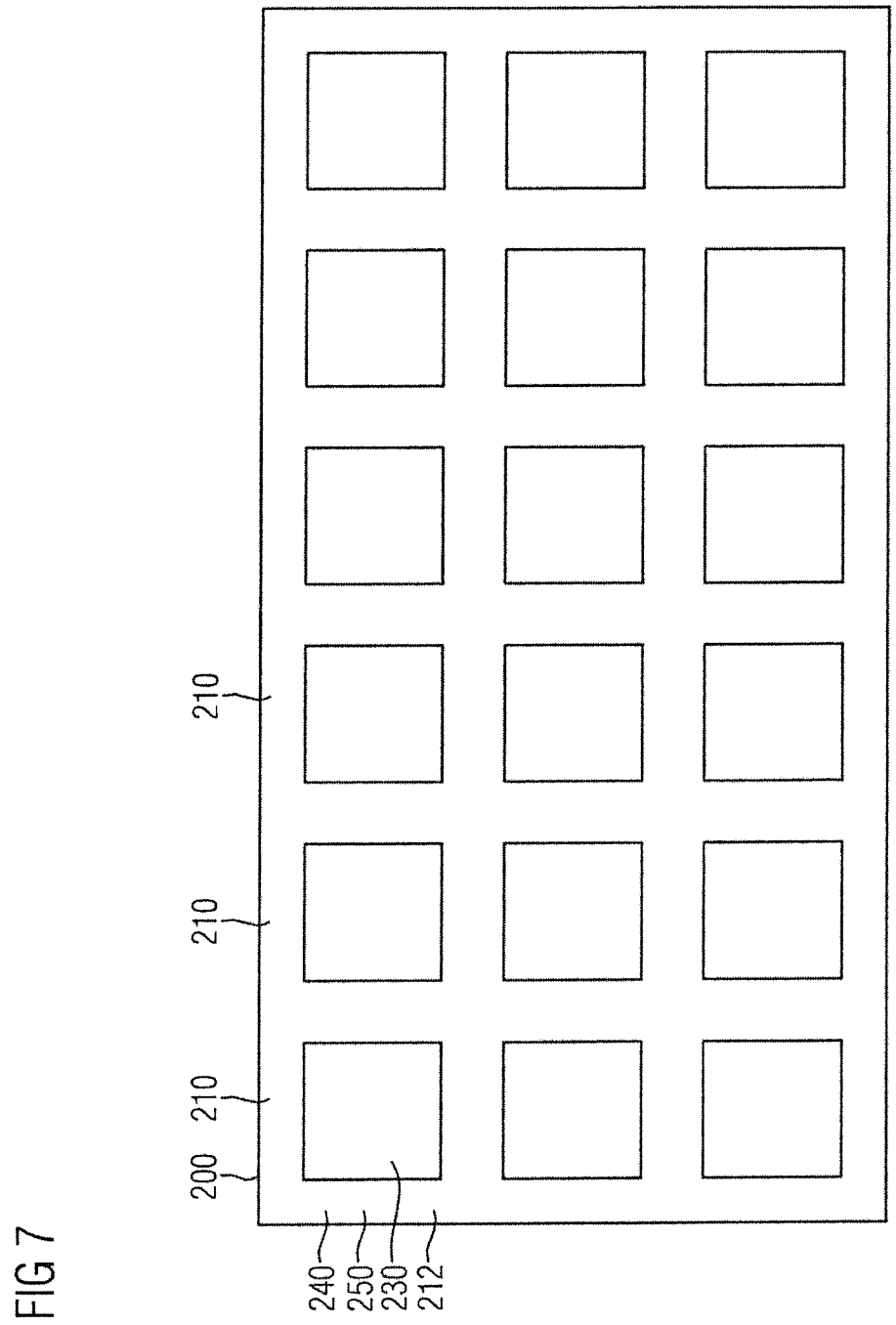

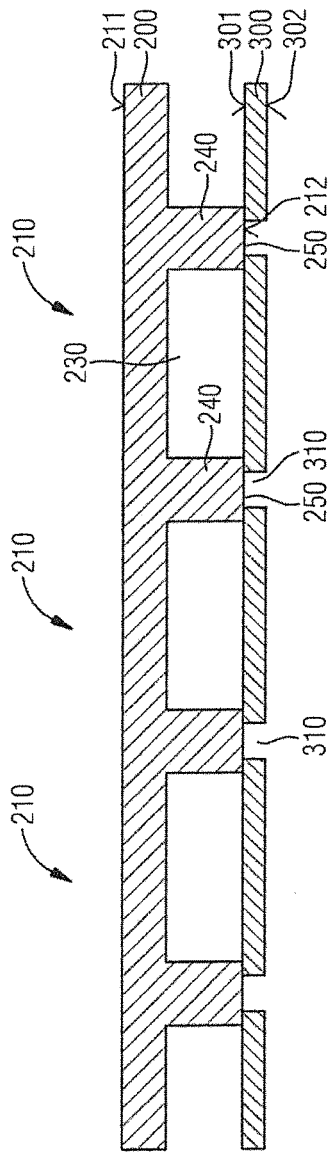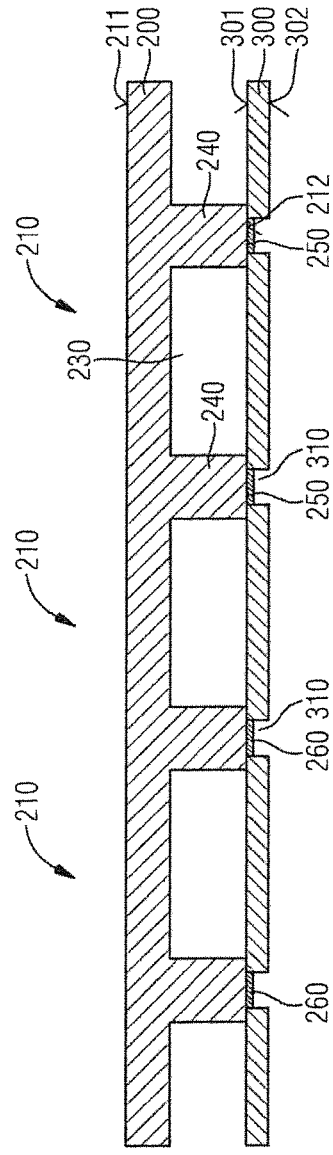

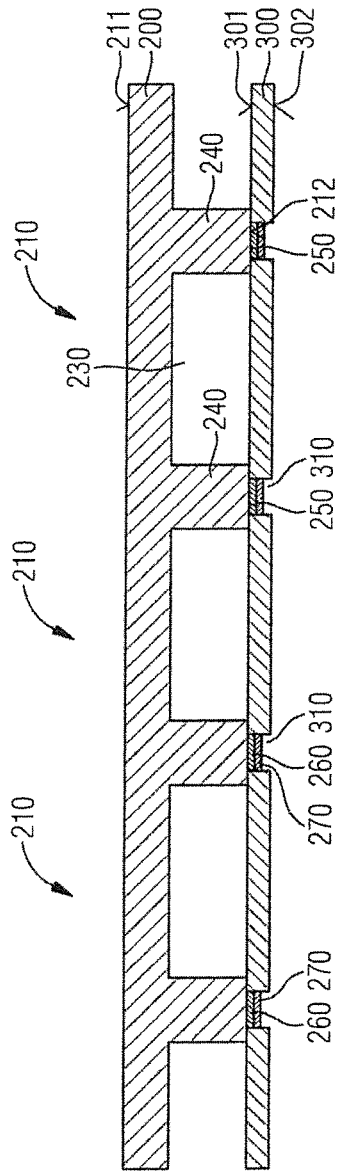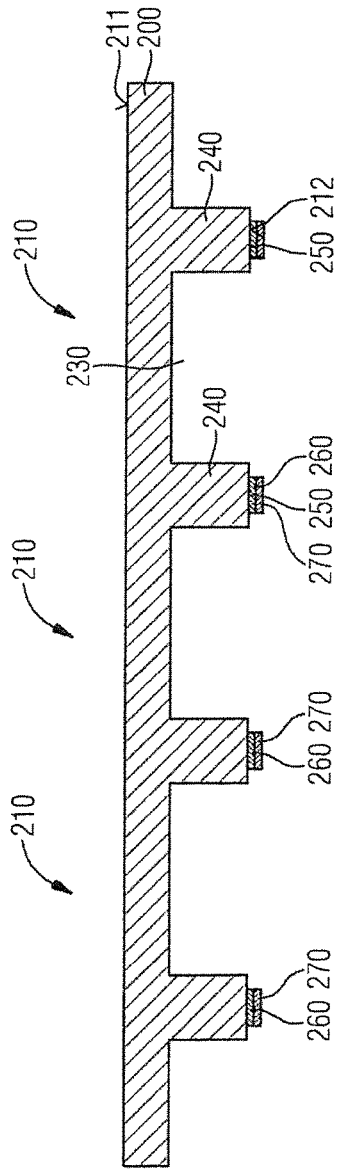

METHOD OF PRODUCING A HOUSING COVER, METHOD OF PRODUCING AN OPTOELECTRONIC COMPONENT, AND OPTOELECTRONIC COMPONENT

TECHNICAL FIELD

This disclosure relates to a method of producing a housing cover, a method of producing an optoelectronic component and an optoelectronic component.

BACKGROUND

Optoelectronic components in which an optoelectronic semiconductor chip, for example, a laser chip is capped under a housing cover in a hermetically sealed manner for protection from ambient influences are known. The housing cover may be configured as optically transparent to allow electromagnetic radiation emitted by the optoelectronic semiconductor chip to pass through. The capping is typically performed by using a glass solder that requires a high process temperature.

SUMMARY

We provide a method of producing a housing cover including providing a cover blank having a mounting surface formed on an underside; connecting the underside of the cover blank to a silicon slice; creating at least one opening in the silicon slice to expose at least part of the mounting surface; arranging a base metallization on the exposed part of the mounting surface; and removing the silicon slice.

We also provide a method of producing an optoelectronic component including providing a lower housing part of an optoelectronic component; producing a housing cover by the method of producing a housing cover including providing a cover blank having a mounting surface formed on an underside; connecting the underside of the cover blank to a silicon slice; creating at least one opening in the silicon slice to expose at least part of the mounting surface; arranging a base metallization on the exposed part of the mounting surface; and removing the silicon slice; and connecting the housing cover to the lower housing part.

We further provide an optoelectronic component with a housing including a lower housing part and a housing cover connected to the lower housing part, wherein the housing cover comprises a glass, and the housing cover connects to the lower housing part by a eutectic solder connection.

BRIEF DESCRIPTION OF THE DRAWINGS

FIG. 5 shows the glass plate after detachment of the first silicon slice.

FIG. 6 shows a sectional side view of an interconnected assembly of cover blanks formed from the glass plate by a grinding process.

FIG. 7 shows a plan view of the interconnected assembly of cover blanks.

FIG. 10 shows the interconnected assembly of cover blanks and the second silicon slice after the creation of openings in the second silicon slice.

FIG. 11 shows the interconnected assembly of cover blanks and the second silicon slice after the arrangement of a base metallization on mounting surfaces of the cover blanks.

FIG. 12 shows the interconnected assembly of cover blanks and the second silicon slice after the arrangement of a solder metallization on the base metallization.

FIG. 13 shows the interconnected assembly of cover blanks after the removal of the second silicon slice.

Figure 1:
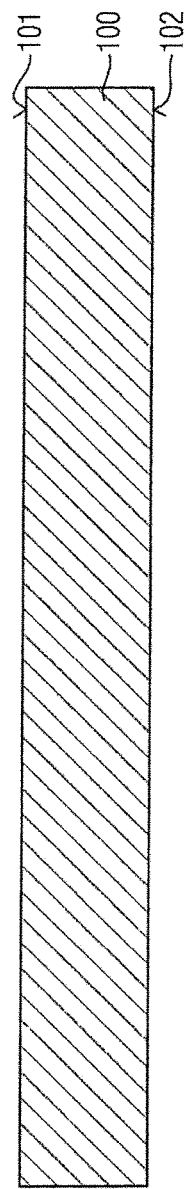
FIG. 1 shows a sectional side view of a first silicon slice.

LIST OF REFERENCE SIGNS 100 first silicon slice
101 upper side
102 underside
110 trench
120 island
130 glass plate
131 upper side
132 underside
200 interconnected assembly
210 cover blank
211 upper side
212 underside
220 antireflective coating
230 cavity
240 wall
250 mounting surface
260 base metallization
270 solder metallization
280 separating plane
300 second silicon slice
301 upper side
302 underside
310 opening
400 housing cover
500 optoelectronic component
510 housing
520 lower housing part
521 upper side
522 underside
530 hollow space
540 optoelectronic semiconductor chip
550 metallization

DETAILED DESCRIPTION

Our method of producing a housing cover comprises steps providing a cover blank having a mounting surface formed on an underside, connecting the underside of the cover blank to a silicon slice, creating at least one opening in the silicon slice to expose at least part of the mounting surface, arranging a base metallization on the exposed part of the mounting surface and removing the silicon slice.

This method advantageously allows production of a housing cover with a base metallization arranged on the mounting surface of the housing cover. The base metallization of the housing cover allows fastening of the housing cover by a metal solder, which advantageously allows hermetically sealed capping with a comparatively low process temperature. This allows the housing cover that can be obtained by the method to be used to produce optoelectronic components with temperature-sensitive component parts.

The silicon slice serves in this method as a hard mask and advantageously allows protection of portions of the cover blank to be kept free before being covered by the material of the base metallization. In this case, the geometry of the base metallization created on the mounting surface can advantageously be defined very exactly.

The method may comprise, after the arrangement of the base metallization, a further step of arranging a solder metallization on the base metallization. The solder metallization may serve during mounting of the housing cover that can be obtained by the method as a metal solder to produce a hermetically sealed connection. The arrangement of the solder metallization on the base metallization on the mounting surface of the housing cover advantageously allows easy mounting of the housing cover that can be obtained by the method.

The solder metallization may comprise AuSn. Such solder metallization advantageously allows reliable fastening of a housing cover comprising a glass.

Arranging of the solder metallization may be performed by a galvanic process, vapor deposition or immersion in liquid solder. As a result, the method advantageously allows easy, quick and low-cost production of the solder metallization with a sufficiently great layer thickness.

The cover blank may comprise a glass. As a result, the housing cover that can be obtained by the method can advantageously be configured as optically transparent to allow electromagnetic radiation, for example, a laser beam to pass through.

The cover blank may be provided in an interconnected assembly along with further cover blanks. In this case, the method comprises a further step of dividing up the interconnected assembly. As a result, the method advantageously allows a plurality of housing covers to be produced in parallel in common processing steps. This reduces the production expenditure required for each housing cover. In particular, the production costs for each housing cover and the time required for each housing cover fall.

The cover blank may be provided with a cavity arranged on the underside. In this case, the mounting surface is arranged on a wall enclosing the cavity. The housing cover that can be obtained by the method can then advantageously be mounted such that a hollow space closed off in a hermetically sealed manner is formed in the region of the cavity of the housing cover. The hollow space may, for example, enclose an optoelectronic semiconductor chip.

Provision of the cover blank may comprise polishing the mounting surface. Polishing the mounting surface of the cover blank advantageously makes it easier to connect the underside of the cover blank to the silicon slice.

Connecting the cover blank to the silicon slice may be performed by anodic bonding. This advantageously allows the reliable connection of the cover blank to the silicon slice.

Creating the opening in the silicon slice may be performed by an etching process, in particular by a wet-chemical or dry-chemical etching process. This advantageously allows production of an opening with a precisely defined geometry at a precisely defined position of the silicon slice. As a result, in a subsequent method step the base metallization can also be arranged with a precisely defined geometry at a precisely defined position on the mounting surface.

The base metallization may comprise TiPtAu. The base metallization arranged on the mounting surface advantageously prepares the mounting surface of the housing cover that can be obtained by the method for production of a connection by eutectic soldering.

Arranging the base metallization may be performed by a cathode sputtering process or by vapor deposition. In this case, the silicon slice with the opening created in the silicon slice can serve as a hard mask. This advantageously allows the base metallization to be created easily, at low cost and quickly.

Removing the silicon slice may be performed by an etching process, in particular by etching with KOH. This advantageously allows the silicon slice to be removed easily, quickly and at low cost.

Our method of producing an optoelectronic component comprises steps of providing a lower housing part of an optoelectronic component, producing a housing cover by a method with the aforementioned features and connecting the housing cover to the lower housing part. This method advantageously allows production of an optoelectronic component with a housing of which the housing cover connects to the lower housing part in a hermetically sealed manner.

Connecting the housing cover to the lower housing part may be performed by eutectic soldering. As a result, the method advantageously only requires a relatively low process temperature to be used, whereby the method is suitable for producing an optoelectronic component with temperature-sensitive component parts.

The lower housing part may be provided with a coating comprising gold. As a result, the lower housing part allows the housing cover to be connected to the lower housing part easily and reliably.

Our optoelectronic component has a housing comprising a lower housing part and a housing cover connected to the lower housing part. The housing cover in this case comprises a glass. The housing cover connects to the lower housing part by a eutectic solder connection. The eutectic solder connection between the housing cover and the lower housing part of the housing of this optoelectronic component may advantageously be configured in a hermetically sealed manner. As a result, a sensitive component part, for example, an optoelectronic semiconductor chip can be encapsulated in the housing of the optoelectronic component in a hermetically sealed manner and thereby protected from harmful environmental influences.

A hollow space may be enclosed between the housing cover and the lower housing part. In this case, an optoelectronic semiconductor chip is arranged in the hollow space. The optoelectronic semiconductor chip may, for example, be a laser chip. By being arranged in the hollow space of the housing of the optoelectronic component, the optoelectronic semiconductor chip is advantageously protected from harmful environmental influences such as moisture or noxious gases.

The hollow space may be sealed hermetically. As a result, the optoelectronic component can advantageously have a particularly long service life and also be suitable for use in harsh environments, for example, for use in the automotive sector.

The properties, features and advantages of our housing covers, methods and components described above and the manner in which they are achieved become clearer and more clearly understandable in connection with the following description of the examples, which are explained in greater detail in connection with the drawings. They are respectively shown in schematized representations.

FIG. 1 shows a schematic sectional side view of a first silicon slice 100. The first silicon slice 100 may, for example, be configured as a wafer. The first silicon slice 100 has an upper side 101 and, opposite from the upper side 101, an underside 102. The upper side 101 and the underside 100 are each configured as planar and are arranged parallel to one another.

Figure 2:
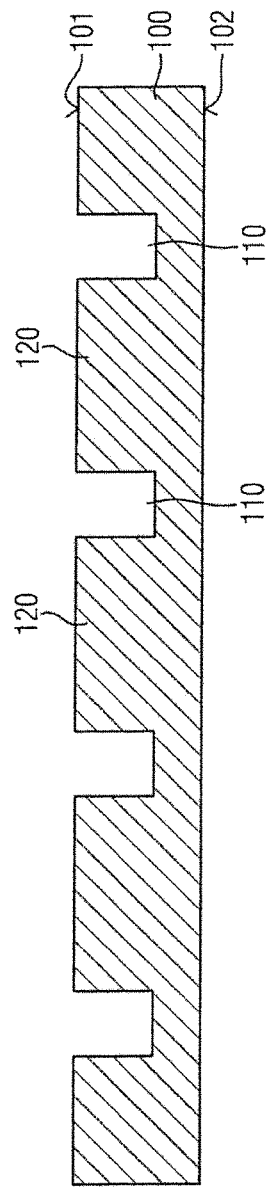
FIG. 2 shows the first silicon slice after the creation of trenches on its upper side.

FIG. 2 shows a schematic sectional side view of the first silicon slice 100 in a processsing state at a time after the representation of FIG. 1. Created on the upper side 101 of the first silicon slice 100 are trenches 110 extending from the upper side 101 into the first silicon slice 100.

Formed between the trenches 110 are islands 120, which are each enclosed in an annular manner by the trenches 110. The islands 120 may, for example, each have a rectangular form in plan view of the upper side 101 of the first silicon slice 100. The islands 120 form a regular two-dimensional field in plan view of the upper side 101 of the first silicon slice 100. The trenches 110 extend between the islands 120 as a regular two-dimensional grid, for example, as a rectangular grid.

The trenches 110 may, for example, have been created by a dry etching process in particular, for example, by deep reactive-ion etching.

Figure 3:
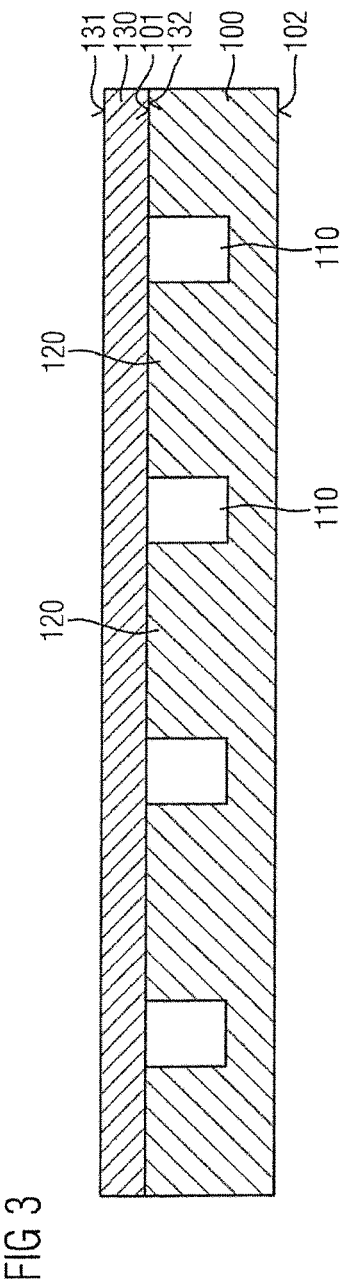
FIG. 3 shows the first silicon slide and a glass plate arranged on the upper side of the first silicon slice.

FIG. 3 shows a schematic sectional side view of the first silicon slice 100 in a processing state at a time after the representation of FIG. 2. A glass plate 130 has been fastened on the upper side 101 of the first silicon slice 100. The glass plate 130 is configured as a flat plate with an upper side 131 and, opposite from the upper side 131, an underside 132. The glass plate 130 may, for example, have the form of a glass wafer.

The glass plate 130 is arranged on the first silicon slice 100 such that the underside 132 of the glass plate 130 faces the upper side 101 of the first silicon slice 100. In this case, the glass plate 130 in particular connects to the islands 120 enclosed by the trenches 110 of the upper side 101 of the first silicon slice 100 and extends in a self-supporting manner over the trenches 110.

The glass plate 130 may, for example, connect to the first silicon slice 100 by anodic bonding.

Figure 4:
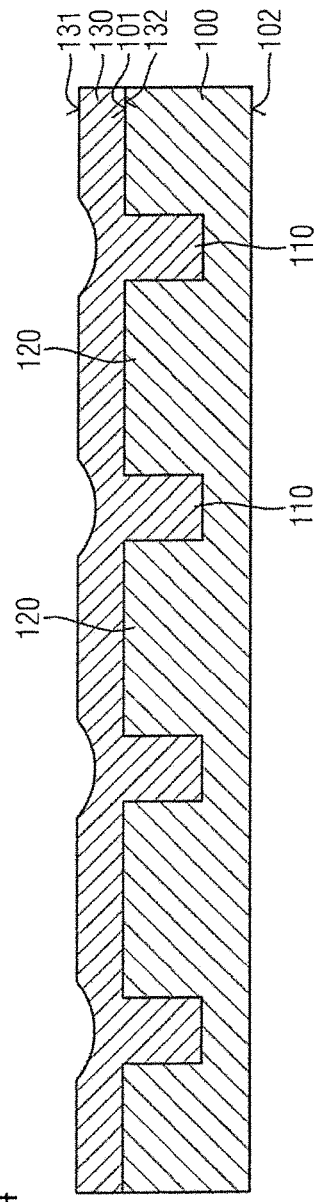
FIG. 4 shows the first silicon slice and the glass plate after the glass has partially flowed into the trenches of the first silicon slice.

FIG. 4 shows a schematic sectional side view of the first silicon slice 100 and the glass plate 130 in a processing state at a time after the representation of FIG. 3. Part of the material of the glass plate 130 has flowed into the trenches 110 arranged on the upper side 101 of the first silicon slice 100 and fills the trenches 110. As a result, the underside 132 of the glass plate 130 replicates the upper side 101 of the first silicon slice 100 with the trenches 110 and the islands 120 and forms a negative of the upper side 101 of the first silicon slice 100.

FIG. 5 shows a schematic sectional side view of the glass plate 130 in a processing state at a time after the representation of FIG. 4. The first silicon slice 100 has been removed from the glass plate 130. Removal of the first silicon slice 100 may, for example, have been performed by an etching process in particular, for example, by etching with KOH. In this case, the first silicon slice 100 may have been broken up completely.

In a subsequent processing step, parts of the upper side 131 and the underside 132 of the glass plate 130 are ground away to smooth the upper side 131 and the underside 132 of the glass plate 130. As a result, an interconnected assembly 200 of cover blanks 210 represented in FIG. 6 in a schematic sectional side view is formed from the glass plate 130.

Each cover blank 210 has an upper side 211 and, opposite from the upper side 211, an underside 212. The upper sides 211 have been formed on the ground-away upper side 131 of the glass plate 130. The undersides 212 have been formed on the ground-away underside 132 of the glass plate 130.

FIG. 7 shows a schematic plan view of the underside 212 of the cover blanks 210 of the interconnected assembly 200. The cover blanks 210 are arranged in the interconnected assembly 200 in a regular two-dimensional field arrangement and connect to one another continuously in one piece.

Each cover blank 210 has on its underside 212 a cavity 230 bounded by a surrounding wall 240. Each cavity 230 has been formed in the region of an island 120 on the upper side 101 of the first silicon slice 100. The surrounding walls 240 have been formed in the trenches 110 of the first silicon slice 100. The end faces of the walls 240 on the undersides 212 of the cover blanks 210 form mounting surfaces 250 of the cover blanks 210.

Figure 8:
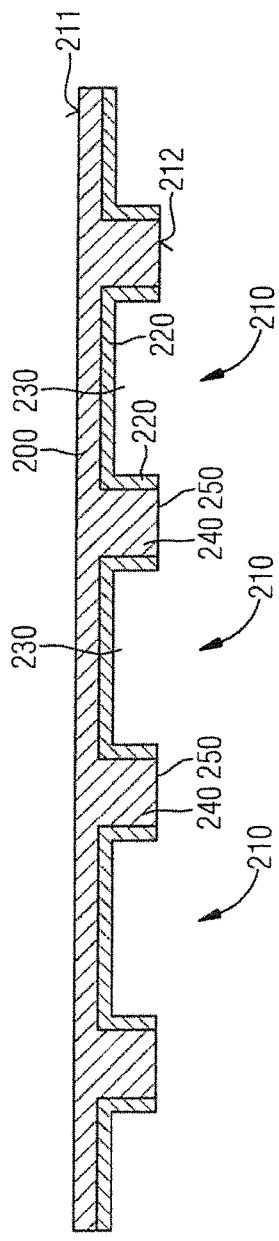
FIG. 8 shows the interconnected assembly of cover blanks with an antireflective coating arranged on it.

FIG. 8 shows a schematic sectional side view of the interconnected assembly 200 of the cover blanks 210 after carrying out an optional further processing step. In this further processing step, an antireflective coating 220 has been arranged on the undersides 212 of the cover blanks 210. The antireflective coating 220 extends over all portions of the undersides 212 of the cover blanks 210 apart from the mounting surfaces 250.

It is possible to dispense with providing the antireflective coating 220. In each of FIGS. 9 to 15 described below, the antireflective coating 220 is not represented, but could optionally be present.

The method described above on the basis of FIGS. 1 to 8 to produce the interconnected assembly 200 of cover blanks 210 merely represents one possibility, given by way of example, to produce the interconnected assembly 200 of cover blanks 210. The interconnected assembly 200 of cover blanks 210 may also be produced in some other way.

Figure 9:
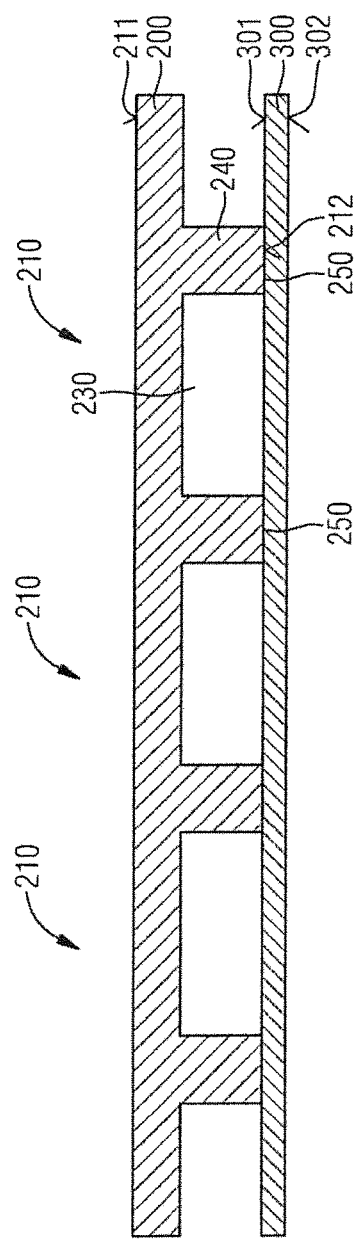
FIG. 9 shows a sectional side view of the interconnected assembly of cover blanks with a second silicon slice arranged on an underside.

FIG. 9 shows a schematic sectional side view of the interconnected assembly 200 of cover blanks 210 with a second silicon slice 300 arranged on the undersides 212 of the cover blanks 210. The second silicon slice 300 is configured as a flat slice with an upper side 301 and, opposite from the upper side 301, an underside 302. The second silicon slice 300 may, for example, be configured as a silicon wafer.

The second silicon slice 300 connects to the interconnected assembly 200 of cover blanks 210 such that the upper side 301 of the second silicon slice 300 faces the undersides 212 of the cover blanks 210 and contacts the mounting surfaces 250 of the cover blanks 210.

The second silicon slice 300 may, for example, have been connected to the cover blanks 210 of the interconnected assembly 200 by anodic bonding.

Before connection of the second silicon slice 300 to the interconnected assembly 200 of cover blanks 210, the mounting surfaces 250 of the cover blanks 210 may have been polished to improve bondability of the mounting surfaces 250 of the cover blanks 210.

FIG. 10 shows a schematic sectional side view of the interconnected assembly 200 of cover blanks 210 and the second silicon slice 300 in a processing state at a time after the representation of FIG. 9. In the second silicon slice 300, one or more openings 310 have been created, extending through the second silicon slice 300 from the underside 302 to the upper side 301 of the second silicon slice 300.

The at least one opening 310 in the second silicon slice 300 is arranged adjacent to the mounting surfaces 250 of the cover blanks 210 so that in the region of the at least one opening 310 the mounting surfaces 250 of the cover blanks 210 of the interconnected assembly 200 are at least partly exposed. At least part of the mounting surfaces 250 of the cover blanks 210 of the interconnected assembly 200 are accessible through the at least one opening 310 in the second silicon slice 300. The at least one opening 310 in the second silicon slice 300 replicates the grid form of the walls 240, having the mounting surfaces 250, between the cavities 230 of the individual cover blanks 210 of the interconnected assembly 200.

The at least one opening 310 in the second silicon slice 300 may, for example, have been created by an etching process in particular, for example, by a wet-chemical etching process or a dry-chemical etching process. The position and geometry of the at least one opening 310 in the second silicon slice 300 may, for example, have been defined by a lithographic process.

FIG. 11 shows a schematic sectional side view of the interconnected assembly 200 of cover blanks 210 and the second silicon slice 300 in a processing state at a time after the representation of FIG. 10. A base metallization 260 has been arranged on the portions of the mounting surfaces 250 of the cover blanks 210 that are exposed by the at least one opening 310 in the second silicon slice 300.

The base metallization 260 may, for example, comprise TiPtAu. The base metallization 260 may, however, also comprise a different metal or a different alloy.

Arranging the base metallization 260 may, for example, have been performed by a cathode sputtering process or vapor deposition. In this case, the material of the base metallization 260 may also have precipitated on the underside 302 of the second silicon slice 300. The material of the base metallization 260 precipitated on the underside 302 of the second silicon slice 300 is in this case removed together with the second silicon slice 300 in a subsequent processing step (lift-off process).

FIG. 12 shows a schematic sectional side view of the interconnected assembly 200 of cover blanks 210 of the second silicon slice 300 in a processing state at a time after the representation of FIG. 11. A solder metallization 270 has been arranged on the base metallization 260 on the portions of the mounting surfaces 250 of the cover blanks 210 that are exposed in the at least one opening 310 of the second silicon slice 300.

The solder metallization 270 may, for example, comprise AuSn. In this case, the solder metallization 270 is suitable for producing a eutectic solder connection.

The arranging of the solder metallization 270 may, for example, have been performed by a galvanic process, vapor deposition or immersion in liquid solder.

It is possible to dispense with arranging the solder metallization 270 on the base metallization 260 on the mounting surfaces 250 of the cover blanks 210 of the interconnected assembly 200.

FIG. 13 shows a schematic sectional side view of the interconnected assembly 200 of cover blanks 210 in a processing state at a time after the representation of FIG. 12. The second silicon slice 300 has been removed from the interconnected assembly 200 of cover blanks 210.

Removing the second silicon slice 300 may, for example, have been performed by an etching process in particular, for example, by etching with KOH. In this case, the second silicon slice 300 may have been broken up completely. Any material of the base metallization 260 and/or of the solder metallization 270 that may be adhering to the second silicon slice 300 has been removed together with the second silicon slice 300.

Figure 14:
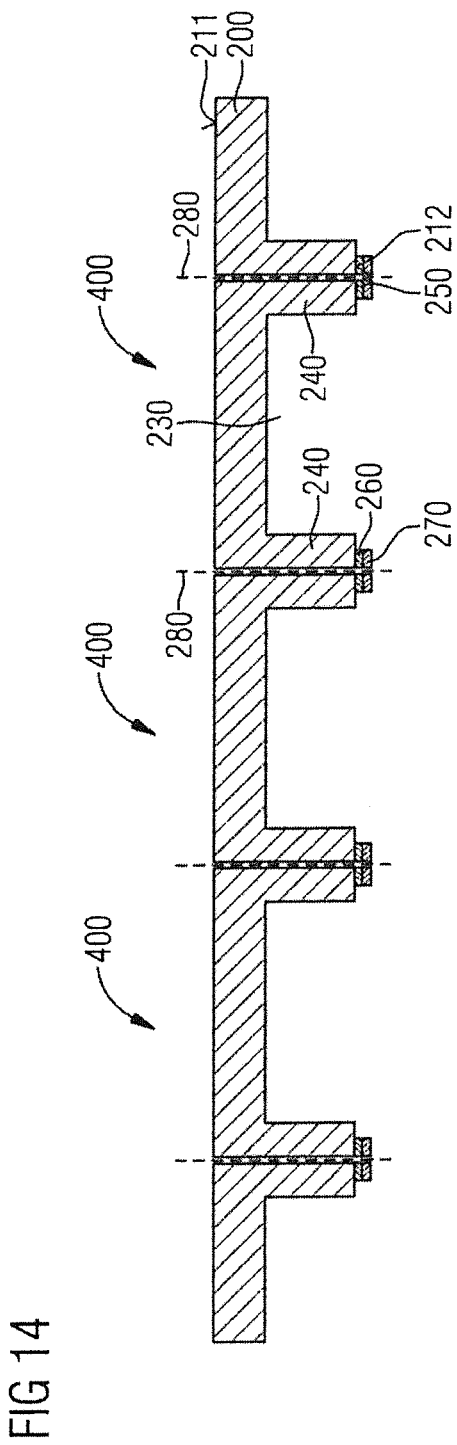
FIG. 14 shows a plurality of housing covers formed by dividing up the interconnected assembly.

FIG. 14 shows a schematic representation of a processing step at a time after the representation of FIG. 13. In this processing step, the interconnected assembly 200 of cover blanks 210 is divided up along separating planes 280 to form a plurality of housing covers 400.

The separating planes 280 run perpendicularly in relation to the upper sides 211 and the undersides 212 of the cover blanks 210 of the interconnected assembly 200 and extend through the walls 240 arranged between the cavities 230 of the individual cover blanks 210. Consequently, the separating planes 280 replicate the grid of the walls 240 of the cover blanks 210 of the interconnected assembly 200.

Dividing up the interconnected assembly 200 at the separating planes 280 may, for example, be performed by sawing in particular, for example, with a wafer saw.

Each housing cover 400 created by dividing up the interconnected assembly 200 is formed from one cover blank 210 of the interconnected assembly 200. Consequently, each housing cover 400 has on its underside 212 a cavity 230 and a wall 240 enclosing the cavity 230. Formed on the wall 240 on the underside 212 of the housing cover 400 is the mounting surface 250. Arranged on at least part of the mounting surface 250 is the base metallization 260. Optionally arranged on the base metallization 260 is the solder metallization 270.

Figure 15:
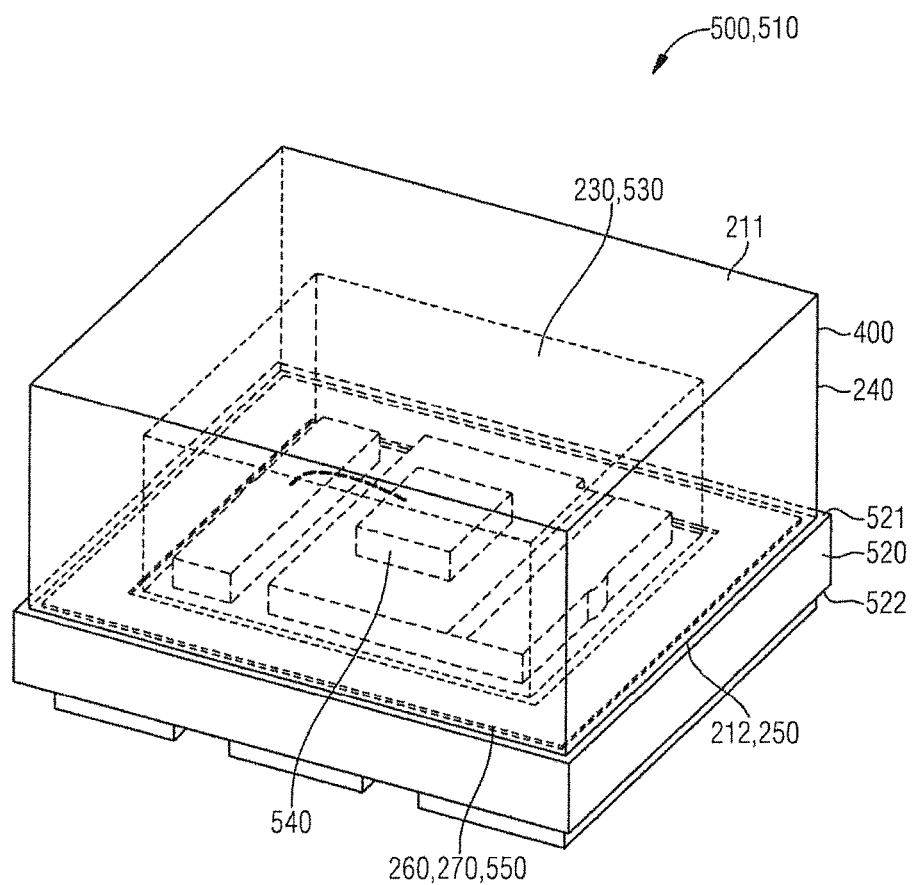
FIG. 15 shows a perspective view of an optoelectronic component having a housing cover.

FIG. 15 shows a schematic perspective representation of an optoelectronic component 500. The optoelectronic component 500 is configured to emit electromagnetic radiation, for example, visible light. The optoelectronic component 500 may, for example, be a laser component that generates and emits a laser beam.

The optoelectronic component 500 has a housing 510 comprising a lower housing part 520 and a housing cover 400 produced by the method described above. The lower housing part 520 may also be referred to as a carrier or substrate. The lower housing part 520 has an upper side 521 and, opposite from the upper side 521, an underside 522.

The lower housing part 520 may, for example, comprise a ceramic material in particular, for example, AlN or $Al_2O_3$. However, the lower housing part 520 may, for example, also comprise silicon.

On the underside 522 of the lower housing part 520 there may be arranged electrical contact pads of the optoelectronic component 500. The optoelectronic component 500 may as a result be suitable as an SMD component for surface mounting, for example, for surface mounting by reflow soldering. On the upper side 521 of the lower housing part 520 there may be formed contact pads connected in an electrically conducting manner to the contact pads arranged on the underside 522 of the lower housing part 520.

The lower housing part 520 of the housing 510 of the optoelectronic component 500 has on its upper side 521 a metallization 550. The metallization 550 may, for example, comprise gold. The metallization 550 may also be referred to as a finish.

The housing cover 400 is arranged on the upper side 521 of the lower housing part 520. In this case, the mounting surface 250 on the underside 512 of the housing cover 500 faces the upper side 521 of the lower housing part 520 and connects to the metallization 550 on the upper side 521 of the lower housing part 520.

The housing cover 400 connects to the upper side 521 of the lower housing part 520 by way of a eutectic solder connection. The eutectic solder connection has been formed from the solder metallization 270 and connects the base metallization 260 on the mounting surface 250 on the underside 212 of the housing cover 400 to the metallization 550 on the upper side 521 of the lower housing part 520.

As described on the basis of FIGS. 9 to 14, the solder metallization 270 may have been provided on the base metallization 260 on the mounting surface 250 of the housing cover 400. Alternatively, however, the solder metallization 270 may also have been provided on the metallization 550 on the upper side 521 of the lower housing part 520. A further possibility is to provide the solder metallization 270 as a preformed element (preform) and arrange it between the mounting surface 250 of the housing cover 400 and the upper side 521 of the lower housing part 520.

The eutectic solder connection between the housing cover 400 and the lower housing part 520 of the housing 510 of the optoelectronic component 500 is hermetically sealed. As a result, the cavity 230 enclosed between the housing cover 400 and the lower housing part 520 of the housing 510 forms a hermetically closed-off hollow space 530.

Arranged in the hollow space 530 is an optoelectronic semiconductor chip 540. By arranging the optoelectronic semiconductor chip 540 in the hollow space 530 of the housing 510 that is closed off in a hermetically sealed manner, the optoelectronic semiconductor chip 540 is protected from environmental influences.

The optoelectronic semiconductor chip 540 is configured to emit electromagnetic radiation, for example, visible light. The optoelectronic semiconductor chip 540 may, for example, be configured as a light-emitting diode chip.

The optoelectronic semiconductor chip 540 connects in an electrically conducting manner to the electrical contact pads of the optoelectronic component 500 arranged on the underside 522 of the lower housing part 520 of the housing 510 of the optoelectronic component 500.

Our methods, housing covers and components have been illustrated more specifically and described in detail on the basis of the preferred examples. Nevertheless, this disclosure is not restricted to the examples disclosed. Rather, other variations may be derived from them by those skilled in the art without departing from the scope of protection of the appended claims.

This application claims priority of DE 10 2015 108 494.5, the subject matter of which is incorporated herein by reference.

The invention claimed is:

1. A method of producing a housing cover comprising:
    providing a cover blank having a mounting surface formed on an underside;
    connecting the underside of the cover blank to a silicon slice;
    creating at least one opening in the silicon slice to expose at least a part of the mounting surface;
    arranging a base metallization on the exposed part of the mounting surface; and
    removing the silicon slice.
2. The method according to claim 1, further comprising, after arrangement of the base metallization, arranging a solder metallization on the base metallization.
3. The method according to claim 2, wherein the solder metallization comprises AuSn.
4. The method according to claim 2, wherein arranging the solder metallization is performed by a galvanic process, a vapor deposition or immersion in liquid solder.
5. The method according to claim 1, wherein the cover blank comprises a glass.
6. The method according to claim 1,
    wherein the cover blank is provided in an interconnected assembly along with further cover blanks, and
    the method further comprises dividing up the interconnected assembly.
7. The method according to claim 1,
    wherein the cover blank is provided with a cavity arranged on the underside, and
    the mounting surface is arranged on a wall enclosing the cavity.
8. The method according to claim 1, wherein providing the cover blank comprises polishing the mounting surface.
9. The method according to claim 1, wherein connecting the cover blank to the silicon slice is performed by anodic bonding.
10. The method according to claim 1 wherein creating the opening in the silicon slice is performed by a wet-chemical or dry-chemical etching process.
11. The method according to claim 1, wherein the base metallization comprises TiPtAu.
12. The method according to claim 1, wherein arranging the base metallization is performed by a cathode sputtering process or a vapor deposition.
13. The method according to claim 1, wherein removing the silicon slice is performed by an etching process.
14. The method according to claim 1, wherein removing the silicon slice is performed by etching with KOH.
15. A method of producing an optoelectronic component comprising:
    providing a lower housing part of an optoelectronic component;
    producing a housing cover by the method according to claim 1; and
    connecting the housing cover to the lower housing part.
16. The method according to claim 15, wherein connecting the housing cover to the lower housing part is performed by eutectic soldering.
17. The method according to claim 15, wherein the lower housing part is provided with a coating comprising gold.

* * * * *